United States Patent [19]

Albin

[11] Patent Number: 4,789,840

[45] Date of Patent: Dec. 6, 1988

[54] INTEGRATED CAPACITANCE STRUCTURES IN MICROWAVE FINLINE DEVICES

[75] Inventor: Robert D. Albin, Santa Rosa, Calif.

[73] Assignee: Hewlett-Packard Company, Palo Alto, Calif.

[21] Appl. No.: 852,861

[22] Filed: Apr. 16, 1986

[51] Int. Cl.[4] ................................................ H03D 9/02

[52] U.S. Cl. ..................................... 329/161; 332/52; 330/286; 330/277; 333/81 B; 333/218; 333/247; 333/250; 333/33

[58] Field of Search ................................ 333/246–248, 333/33, 26 R, 21 R, 218, 247, 250, 81 B; 455/325–328, 323; 330/286, 277; 332/52; 329/160, 161

[56] References Cited

U.S. PATENT DOCUMENTS

| | | | |
|---|---|---|---|
| 3,914,713 | 10/1975 | Konishi et al. | 333/21 R |
| 4,157,516 | 6/1979 | Van de Grijp | 333/26 |
| 4,291,278 | 9/1981 | Quine | 330/286 |
| 4,425,549 | 1/1984 | Schwartz et al. | 333/247 X |
| 4,541,120 | 9/1985 | Szabo | 455/327 X |
| 4,627,104 | 12/1986 | Knöchel | 455/327 |
| 4,642,584 | 2/1987 | Funck et al. | 333/247 X |
| 4,661,997 | 4/1987 | Roberts et al. | 455/327 |

FOREIGN PATENT DOCUMENTS

| | | | |
|---|---|---|---|
| 3330099 | 3/1985 | Fed. Rep. of Germany | 333/247 |

OTHER PUBLICATIONS

Holger Meinel and Lorenz-Peter Schmidt of AEG-Telefunken, "High Sensitivity Millimeter Wave Detectors Using Fin-Line Technology", *Conference Digest of Fifth International Conference on Infrared & Millimeter Waves, Wuerzburg, West Germany, 1980, pp. 133–135.*

Cornelius J. Verver and Wolfgang J. R. Hoefer, "Quarter-Wave Matching of Waveguide-to-Finline Transitions", *IEEE Transactions on Microwave Theory and Techniques,* vol. MTT-32, No. 12, Dec. 84.

*Primary Examiner*—Eugene R. LaRoche
*Assistant Examiner*—Seung Ham
*Attorney, Agent, or Firm*—William C. Milks, III

[57] ABSTRACT

A finline structure comprises a dielectric substrate-mounted circuit disposed within a waveguide having on the substrate integrated distributed capacitance elements at least partially formed by laterally separated metallization layers. Thin-film construction techniques may be employed in construction. In general, the distributed capacitance elements permit the biasing of a plurality of circuit elements in a finline transmission medium. In selected structures, r.f. continuity is effected between traces and metallization layers while maintaining d.c. isolation. Examples are described of circuits which can incorporate an integrated capacitor, including but not limited to detectors, r.f. modulators, r.f. attenuators, amplifiers, and multipliers. According to the invention, a plurality of elements, as well as multiple port elements, may be selectively biased while retaining d.c. isolation and r.f. continuity. Moreover, the versatility of construction allows for higher levels of integration as well as the realization of new topologies previously unattainable. Since the capacitance structure is integrated into the thin film circuit, fewer discrete parts are required and the manufacturing process may be precisely controlled by photolithography.

54 Claims, 7 Drawing Sheets

INTEGRATED CAPACITANCE STRUCTURES IN MICROWAVE FINLINE DEVICES

BACKGROUND OF THE INVENTION

This invention relates to microwave finline devices for signal detection and the like and more particularly to millimeter wave finline structures using integrated capacitor technology. The invention is particularly useful for detection for microwave energy having a fundamental frequency of above about twenty-five GHz.

Heretofore, most microwave waveguide detection devices have employed precision machined conventional waveguide technology. The accuracy of machining of parts becomes of critical importance with shorter wavelengths of interest. For example, wavelengths of interest include those on the order of five (5) mm. at about sixty (60) GHz. A significant problem with detectors for such high frequencies and short wavelengths is inherently poor impedance match between detection diodes and the waveguide, which results in loss of power as represented by a VSWR as great as 3:1. Other problems will be apparent hereinafter.

Because of further problems with respect to the structure of conventional waveguide detectors involving high precision probes and cavity shaping, it has been suggested that finline technology be employed. One such suggestion is found in a paper published by Holger Meinel and Lorenz-Peter Schmidt of AEG-Telefunken entitled "High Sensitivity Millimeter Wave Detectors using Fin-Line Technology", *Conference Digest of Fifth International Conference on Infrared & Millimeter Waves,* Wuerzburg, West Germany, 1980, pages 133–135. Therein the authors suggest the use of a millimeter wave detector using finline technology in which a Schottky diode is used as a detection element. The structure uses a quartz substrate mounted in a waveguide.

FIG. 1 herein represents a finline structure 10 reconstructed from the brief description in the prior art Meinel et al. paper. It shows a dielectrically loaded finline circuit 12 on a quartz dielectric substrate 14 in a waveguide 16. (Interior waveguide boundaries are shown partially in phantom. In the cited publication, surface and waveguide boundaries are not illustrated.) Metallization layers 18, 19 on the front surface 21 of the dielectric substrate 14 are shown to be provided, the layers 18, 19 having in surface pattern an input taper 20 and an output taper 22. Metallization layer 18 is presumed to be in d.c. contact with the waveguide 16, and metallization layer 19 is presumed to be d.c. isolated from the waveguide 16. Detected signals are presumably obtained from metallization 19. At the point of minimum exposed dielectric width 23 there is shown a junction between first metallization layer 18 and second metallization layer 19 through a zero-bias Schottky diode 24. An absorber 26 is provided according to the Meinel et al. description on the back surface of the substrate 14 which is applied along a straight taper. It is assumed the absorber 26 provides for progressive absorptive termination of the waveguide. No provision appears to have been made therein for impedance matching of the substrate 14 directly with the enclosing waveguide. Moreover, there is no suggestion for enhancements to the detection circuit, other than the use of a diode.

Heretofore it has not been possible to selectively bias multiple circuit elements of finline structures because of the difficultly in providing lossless r.f. continuity while at the same time maintaining d.c. isolation between traces in the finline structure. In the past, bias has been applied to a finline structure by biasing the entire fin by an external d.c. supply. Wave traps in the form of polyiron cavities have been provided in the waveguide forming structures to inhibit undesired reflections. Because an entire fin is biased at the same potential, all circuit elements across a finline gap are necessarily biased equally. Thus the known technique is primarily limited to use with two-terminal devices.

Matching the impedance of a free-space waveguide to a finline structure is important. Various techniques have been proposed. For example, quarter-wave transition matching transformers have been proposed. Such a technique is discussed in Verver et al., "Quarter-Wave Matching of Waveguide-to-Finline Transitions," *IEEE Transactional on Microwave Theory and Techniques,* Vol. MTT-32, No. 12, December 1984, pp. 1645–1647. Therein it is suggested that the transition from free space to dielectric loading of the waveguide cannot be reflectionless because of the discontinuity introduced by the dielectric. The proposed solution, namely a quarter-wave matching stub extending along the waveguide axis into the free-space waveguide from the finline structure, provides an inherently narrow frequency match. There is thus a need for a solution which offers broadband impedance matching.

While finline technology appears to provide promise, characteristics heretofore assumed to exist for dielectric materials have suggested against certain types of structures. Accordingly, the present invention is directed to advancing the state of finline technology to increase versatility and usefulness over the art heretofore known.

SUMMARY OF THE INVENTION

According to the invention, a finline structure comprises a dielectric substrate-mounted circuit disposed within a millimeter waveguide, said substrate circuit comprising a substrate having a surface sufficiently smooth to support integrated distributed capacitance elements of predefinable characteristics, and distributed capacitance elements being at least partially formed by laterally separated metallization layers. In general, the distributed capacitance elements permit the biasing of a plurality of circuit elements in finline transmission medium. In selected structures, r.f. continuity is effected between traces and metallization layers while maintaining d.c. isolation. Examples of circuits which can incorporate an integrated capacitor include but are not limited to detectors, r.f. modulators, r.f. attenuators, amplifiers, and multipliers.

In a specific embodiment, a detector is defined wherein the metallization layers form, together with the dielectric substrate, a pattern defining a shorting stub-type matching termination, an impedance matching network with exponential taper, and a detection region. A discrete (non-integrated) diode is mounted at the narrowest juncture in the detection region (the finline gap) thereby defining a detection site. Structures including a metallization layer, dielectric layer, a metallization bridge layer and the substrate define distributed capacitances built into the matching network. In addition, the leading edge of the dielectric substrate as mounted in a waveguide may be shaped in a gradual taper to form a broadband transition from a free-space waveguide to a dielectrically loaded waveguide. Other structures incorporating the invention are constructed in a similar fashion with bias connections through traces leading to terminals external to the waveguide in which the subject finline structure is mounted.

A detector according to the invention provides for minimum reflections and maximum energy transfer at the detection site. The structure is readily fabricated employing photolithographic techniques.

Circuits constructed according to the invention are not limited in bias options to uniform bias or to only two-terminal circuit elements. A plurality of elements, as well as multiple port elements, may be selectively biased while retaining d.c. isolation and r.f. continuity. Moreover, the versatility of construction allows for higher levels of integration as well as the realization of new topologies previously unattainable. Since the capacitance structure is integrated into the thin film circuit, fewer discrete parts are required and the manufacturing process may be precisely controlled by photolithography.

The invention will be better understood by reference of the following detailed description in connection with the accompanying drawings.

DETAILED DESCRIPTION OF SPECIFIC EMBODIMENTS

Figure 1:
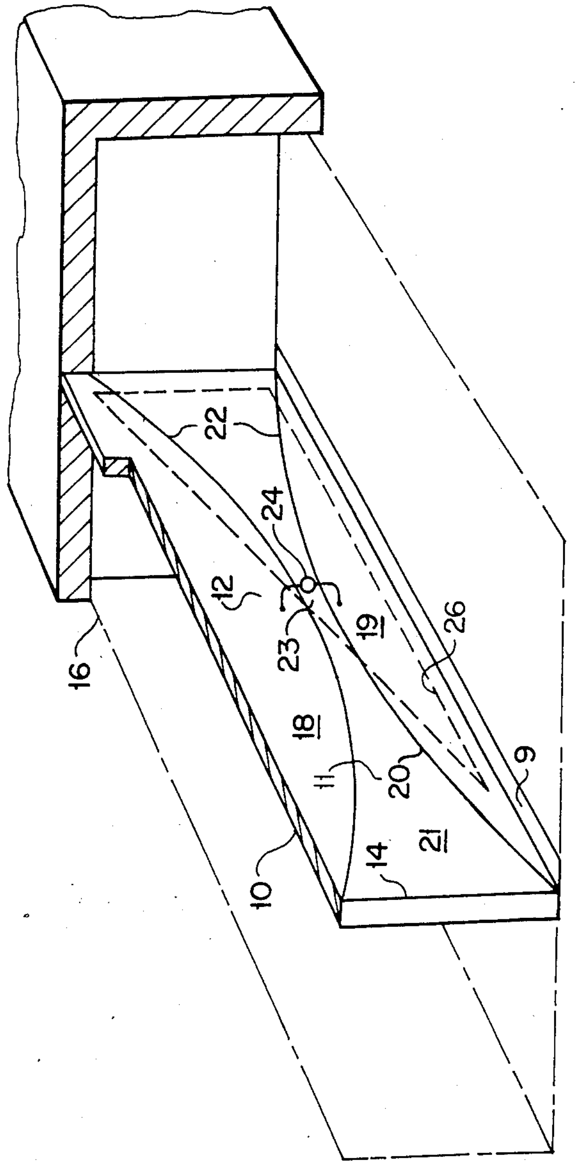
FIG 1 (PRIOR ART)
FIG. 1 is a perspective view of a prior art finline detector.

Referring now to the drawings, FIG. 1, as previously described, depicts one suggestion in the published literature of a finline detection device. FIGS. 2 through 11 illustrate embodiments of the present invention.

Figure 2:
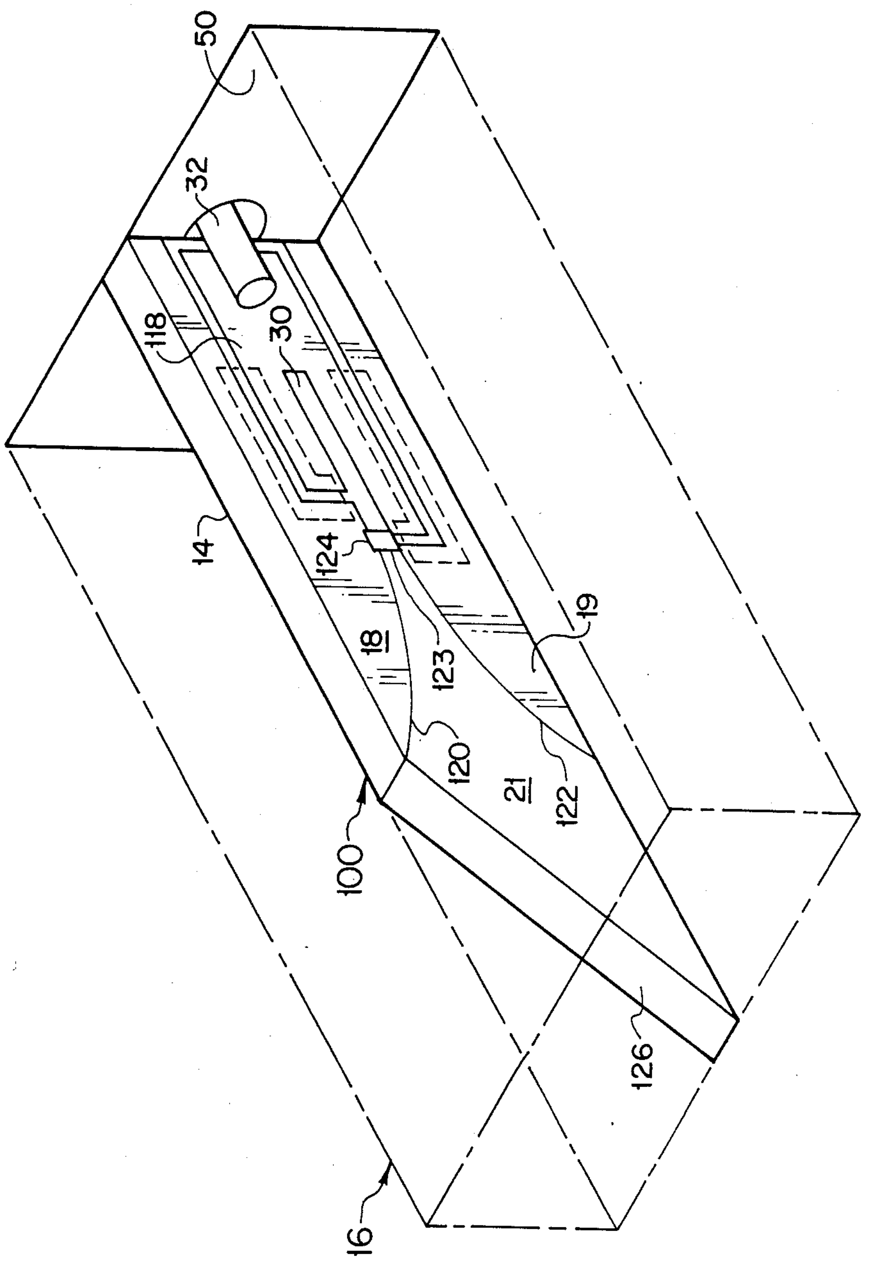
FIG. 2 is a perspective view of a finline detector having integrated distributed capacitance elements in accordance with one embodiment of the invention.

In FIG. 2, there is shown a finline structure 100 mounted within the interior boundaries of a waveguide 16. A typical waveguide 16 is a Type WR-19 waveguide designed for a center frequency of 50 GHz with a design operating frequency range of 40 GHz to 60 GHz. However, the present invention is not solely limited to this range of operation as other structure sizes and frequencies ranges can have the same basic features or produce the same basic conditions characteristic of the present invention. In the structure illustrated in FIG. 2, the interior cross-sectional dimension of a standard WR-19 waveguide is 2.39 mm height by 4.78 mm width.

According to the invention, a finline circuit 100 is formed on a dielectric substrate 14 with at least one integrated distributed capacitance element 42 or 44 wherein a dielectrically insulated bridge is provided along a gap 56 or 66 separating metallization layers 18,118 or 19, 118. In the embodiment of a detector as illustrated in FIG. 2, the finline circuit according to the invention is mounted within the waveguide 16 extending between interior walls in the narrower (height) dimension, with a junction element 124 mounted to metallization layers 18, 19, 118 of the finline circuit 100.

Metallization layers 18, 19 and 118 on the front surface 21 of the dielectric substrate 14 are provided in a specific example such that the metallization layers 18, 19 define input tapers 120, 122 in surface pattern on the substrate and layer 118 define a slot 30 of dielectric material exposed in the waveguide 16. The slot 30 forms a matching stub of predefined length along the front surface 21. At the point of minimum exposed dielectric width 123, there is a junction element 124 between first metallization layer 18, second metallization layer 19 and third metallization layer 118. The junction element 124 is a matching network as explained in connection with FIG. 3.

Unlike the Meinel et al. structure of FIG. 1, an absorber is not provided on the rear surface of the dielectric substrate 100. Moreover, unlike the Verver et al. teaching, a quarter wave matching stub is not provided at the leading edge of the finline substrate. Instead, according to the invention, the leading edge of dielectric substrate 100 is a leading edge taper 126 to introduce a smooth impedance transition from a free-space waveguide to a dielectrically-loaded waveguide of a relatively high dielectric coefficient. The leading edge taper defines a gradual transition along the length of the waveguide 16 from one wall to the opposing wall. The leading edge taper 126 is preferably tapered from zero waveguide height to maximum waveguide height at an angle not exceeding thirty (30) degrees. A straight taper is simple and convenient for manufacturing purposes, and it provides for orderly impedance transition and improved reflection coefficient for the finline circuit.

In a specific embodiment, the thickness of the dielectric substrate 14 is selected to be on the order of 0.25 mm. This thickness is consistent with the preferred thickness of a simple dielectric sheet in a dielectrically-loaded waveguide designed to operate at about 50 GHz.

Heretofore it has generally been considered impractical or impossible to incorporate integrated or thin-film circuit elements in a finline structure. Some prior finline substrates were constructed primarily of a coarse-surfaced material, such as a material having the brand name Duroid and manufactured by the R. T. Rogers Company. Duroid is a glass dispersed in an elastomeric dielectric such as Teflon, which is an elastomeric material manufactured by DuPont. The surface of Duroid is in general too coarse to serve as a substrate for integrated circuit elements. Therefore, according to the invention, the dielectric substrate 100 is preferably a smooth or even polished material, and preferably the dielectric substrate 100 is formed of sapphire or fused silica quartz. The dielectric constant may be on the order of 3.8. The impedance transition provided by the leading edge taper 126 allows for practical use of a substrate material having a relatively high dielectric constant, as explained hereinabove.

The metallization layers 18, 19 and 118 may be formed of any highly conductive material which will bind to the surface of the material forming the substrate 100. For example, the metallization layers may be formed of gold or silver. Gold is preferred due to its high conductivity and its corrosion resistance.

A detected signal must be extracted from the waveguide 16. To this end, the metallization layer 118 is d.c. coupled to an output probe 32 through a rear wall 50 of the waveguide 16. Metallization layer 118 is d.c. isolated from the waveguide 16. However, there is an r.f. short across dielectric boundaries of the metallization layers 18, 19 and 118, as explained hereinafter.

Figure 3:
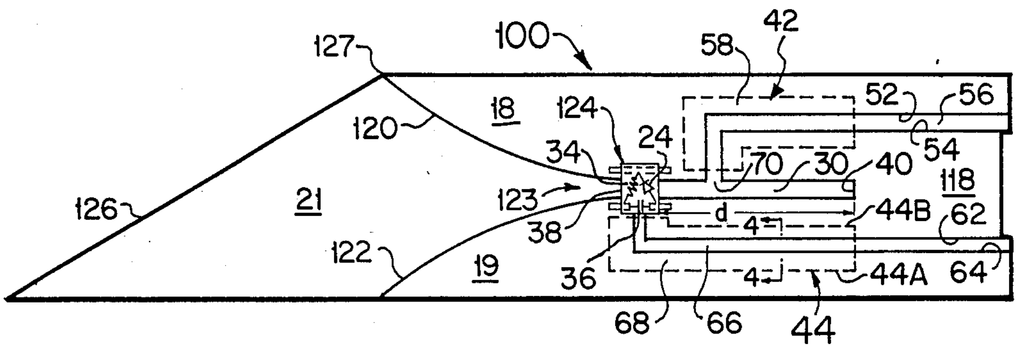
FIG. 3 is a plan view showing details of a finline region of a finline detector with a matching termination.

Referring now to FIG. 3, there is shown in greater detail in a plan view the surface 21 of the finline structure 100 according to the invention. The metallization layers 18 and 19 each define curvilinear tapers 120 and 122, respectively, on the front surface 21 of the dielectric substrate 14. The metallization layers together define a transition region from maximum dielectric exposure (wall to wall in the waveguide 16) upstream of the detection region 123 to minimum dielectric exposure at the detection region 123. The minimum separation between metallization layer 18 and metallization layer 19 is preferably about 0.15 mm at the detection region 123. The surface tapers 120 and 122 of the metallization layers 18 and 19, respectively, commence (when viewed in the direction of expected energy flow) at the termination 127 of the taper of leading edge 126 and extend along the axis of the waveguide 16 preferably about 1.3 wavelengths (when measured at the center or design frequency of the waveguide) to the detection region 123.

The tapers 120 and 122 preferably conform to an exponential taper as a function of impedance, i.e., $z=\exp[(z/L)*\ln(Z_L)]$, where $Z_L$ is the load impedance at the detector region 123, L is the length of the taper, Z is the local impedance, and z is the length measure along the axis of the waveguide. The value L may be chosen, for example, to be sufficiently large such that values of z representing greater than 1.3 wavelengths do not differ significantly from a metallization profile parallel with the waveguide axis downstream of the detection region 123. In fact, the slot 30 downstream of the detection region 123 may preferably be formed of straight parallel opposing margins of the metallization layers along the axis of the waveguide.

The detection means 124 as shown in FIG. 3 preferably comprises a hybrid chip component carrier 38 containing a low-barrier or a zero-bias Schottky diode 24 for detection and a lumped-element resistor 34 for impedance matching. An optional lumped-element capacitor 36 may be optionally provided in the component carrier 38. The value is included with the intrinsic capacitance of the the carrier 38 at the gap formed between metallization layers 19 and 118. The purpose of capacitor 36 is to maintain d.c. voltage on the d.c.-isolated metallization layer 118 to permit voltage detection of an r.f. signal. The component carrier 38 may be mounted to the substrate surface 21 by conventional mounting techniques. The diode 24 is mounted with its cathode terminal coupled to metallization layer 18 and with its anode terminal coupled to metallization layer 118 in a region less than approximately one-quarter wavelength electric distance d (at 50 GHz) from the backshort termination 40. It is the slot 30 which defines the backshort to the dielectric substrate 14 of up to approximately one-quarter wavelength in electrical length. The purpose of the backshort and its choice of length is as follows: The diode 24 exhibits intrinsic junction capacitance which must be counteracted if detection sensitivity is not to degrade with changing wavelengths of operation. One purpose of the backshort formed by slot 30 is to provide a shunt inductance across the intrinsic junction capacitance. The proper shunt inductance appears across the intrinsic junction capacitance at intended operating frequencies when the length d of the backshort is slightly less than about one-quarter wavelength, as measured from the position of a terminal of diode 24 to the backshort termination 40 of the slot 30. The added shunt inductance tends to improve waveguide to detector matching and to improve the flatness of detector frequency response.

The length d of the slot 30 forming the backshort should be shorter than one-quarter wavelength at the center frequency of the waveguide for several reasons. First, the slot 30 must be physically shorter than one-quarter wavelength (at a midband of about 50 GHz) to assure that the backshort appears inductive at the diode 24 at the intended operating frequencies. Second, the current flow around the discontinuity in the surface of the metallization layer 118 appears inductive in nature to the equivalent circuit, suggesting that the slot 30 could be even shorter than would at first be calculated.

In addition, the lumped element resistor 34 of the detection means 124 provides a needed resistive match for detection. Without the resistor 34, the input match is otherwise a strong function of input power to the finline structure 100. The lumped element resistor 34, which is typically of a value of about 250 Ohm, appears in shunt across the detection diode 24 and is thus in shunt with the characteristic video impedance of the diode 24. Values for the lumped element resistor 34 are chosen for optimum detection sensitivity and match between the waveguide and the finline detector.

According to the invention, distributed capacitances are formed directly on the surface 21 of the finline structure 100. The distributed capacitances provide r.f. coupling with d.c. isolation for purposes such as detector voltage storage, selectively controlled biasing and many other applications. The versatility afforded by distributed capacitance structures are particularly advantageous at microwave frequencies because photolithographic techniques can be employed to form precisely-controlled integrated structures. Details of an exemplary distributed capacitance structure are described in connection with FIG. 4.

In FIG. 3, two examples are depicted of thin-film capacitors 42 and 44 mounted on the front surface 14 of a finline structure in accordance with the invention. Capacitor 42 is formed along facing portions 52 and 54 of respective metallization layers 18 and 118 along a slit 56 together with dielectric layers 58 underlying the slit 56, as hereinafter explained. The slit 56 extends from the region of the slot 30 adjacent the detection region 123 to the rear wall 50.

Capacitor 44 is formed along facing portions 62 and 64 (herein also referred to metallization layer margins) of respective metallization layers 19 and 118 along a slit 66 together with dielectric layers 68 underlying the slit 66, as hereinafter explained. Capacitor 44 is in parallel with optional lumped capacitor 36 and as such is additive in capacitance value and may be substituted therefor in selected applications. The slit 66 extends from the region of the slot 30 adjacent the detection region 123 to the rear wall 50. Slit 66 is bridged by the capacitor 36 or the equivalent energy storage device, such as capacitor 44. Each of the regions across each of the slits 56, 66 bounding slot 30 is called a gap region, or more specifically first gap region 70 and second gap region 72.

Figure 4:
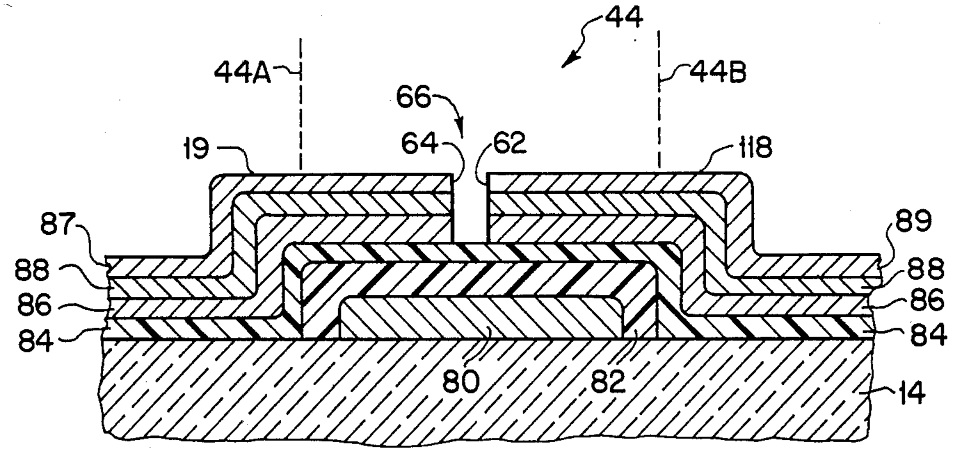
FIG. 4 is a side cross-sectional view of a finline construction providing distributed capacitance in accordance with the invention.

The lateral boundaries 44A and 44B of typical capacitor 44 are outlined in phantom and are similarly designated in FIG. 4. The entire capacitor 42 extends from the gap region 70 toward the rear wall 50 along the slit 56. The entire capacitor 44 extends from the gap region 72 toward the rear wall 50 along the slit 66. The materials forming the distributed capacitors 42 and 44 are mounted via thin-film techniques over an area of the surface 21.

Referring now to FIG. 4, there is shown a side cross-sectional view (along lines 4—4 of FIG. 3) of a typical distributed capacitor 44 in accordance with the invention. The ratio of vertical to planar dimensions is highly exaggerated for illustration purposes. Typical thicknesses of the layers are in the sub-micrometer range. The distributed capacitance means 44 according to the invention is photolithographically formed in thin film on dielectric substrate 14 in layers of the following composition: A base metallization layer 80 of for example tantalum directly upon the substrate 14 within the boundaries of capacitor 44, as indicated in phantom; the base layer 80 being oxidized to form an intermediate layer 82 of tantalum pentoxide, likewise within the boundaries of capacitor 44, but completely covering the base layer 80; a thin-film stratum 84 forming the dielectric bridging under metallization layers 118 and 19; the thin-film dielectric stratum being of for example silicon dioxide; and metallization strata 86 (of tantalum nitride), 88 (of chrome) and 87 or 89 (of gold) defining the metallization layers 118 or 19. Chrome is of particular importance as an adhesion layer between the layers of gold and tantalum nitride. Tantalum nitride binds with silicon dioxide but not with gold. Chrome binds with both tantalum nitride and gold and is therefore a suitable adhesion medium.

The slit 66 is formed through layers 86, 88 and the metallization layers (118 or 19) to the layer 84 of silicon dioxide. Each of these layers is applied by thin-film photolithographic techniques, a procedure believed to be new among microwave finline structures.

Figure 5:
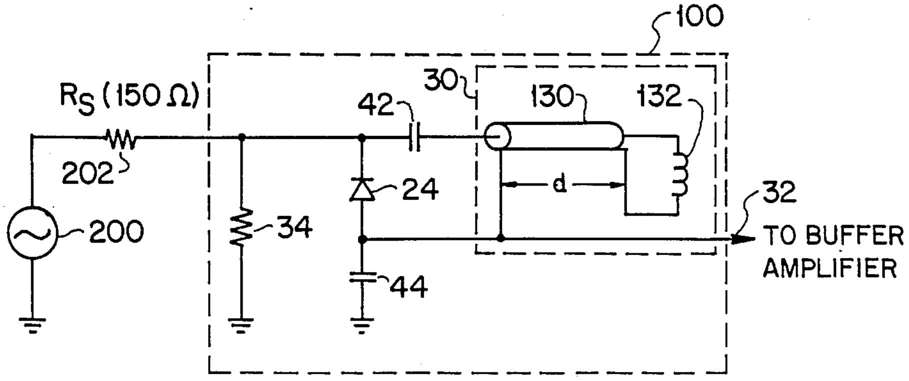
FIG. 5 is a schematic diagram depicting a lumped element equivalent circuit of a detector in accordance with the invention.

FIG. 5 is a schematic of an approximate equivalent circuit of the finline structure 100 of FIG. 2, together with a signal source 200 and source resistance 202. The source resistance has a typical value in the range of $Rs=150$ Ohm. Impedance matching resistor 34 represents the resistance required for a good match between the loaded waveguide and the detector defined by structure 100. The input resistance is shunted across the input to the structure 100. Diode 24 is a.c. coupled to ground through capacitor 44 and a.c. coupled to a termination element (slot 30) though capacitor 42. A current path is provided between the anode of diode 24 and the output terminal 32. The termination element 30 comprises the equivalent of a delay line 130 having as a termination an inductive load 132.

The inductive load is coupled across the unbalanced termination of the delay line 130. The unbalanced side of the delay line 130 is coupled to the anode of the diode 24 to provide a complete rectified a.c. signal path through the diode 24 and inductor 132. The detectable signal is derived from this signal path. It is to be understood that modeling of a finline circuit is not precise due to the nature of the structure and the signal paths. The inductor-diode signal loop for example represents the current flow path around the slot 30 in the metallization layer 118.

Operation of the circuit should be apparent from the preceding description. In summary, whenever an r.f. signal is applied to a waveguide containing the finline structure 100 according to the invention, an a.c. (e.g., sinusoidal) voltage is developed across the input or matching resistor 34. The nonlinear element, namely the low barrier diode 24 will conduct current in a sense or direction such that a d.c. voltage will appear on the metallization layer 118. The capacitances 42 and 44 provide an r.f. signal path through the metallization layer 118. A capacitor, such as optional capacitor 36 of FIG. 3 or distributed capacitor 44, serves to maintain the d.c. voltage on the metallization layer 118 for voltage level detection, as well as to provide a good r.f. path between metallization layers 19 and 118. Signals may be picked off at the probe output terminal 32 and supplied to a buffer amplifier (not shown) for processing.

Figure 6:
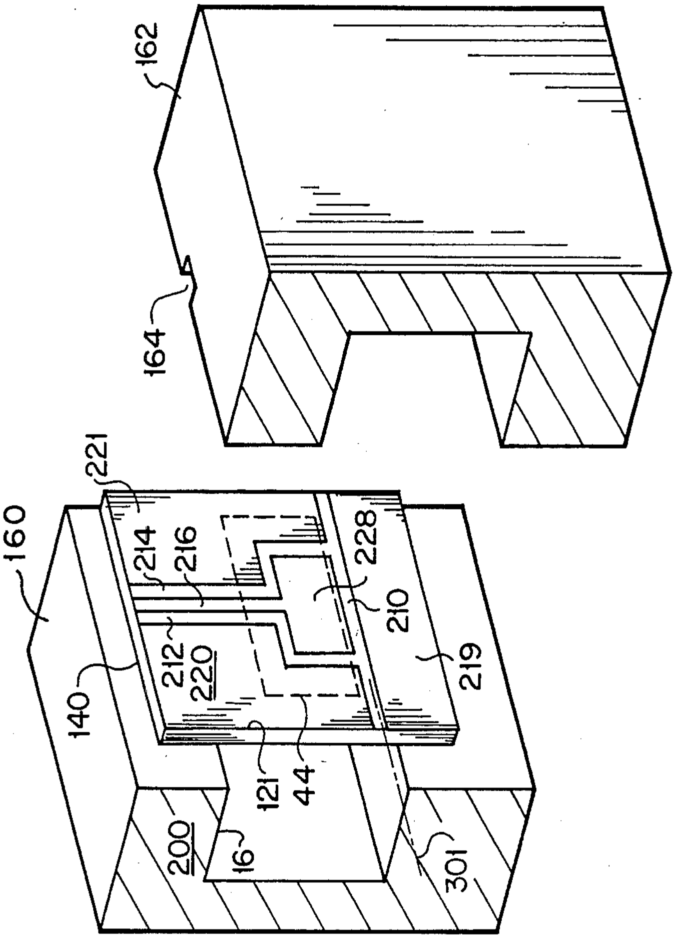
FIG. 6 is a perspective view of a finline structure illustrating construction of a simple biasing configuration.

Referring now to FIG. 6 there is shown a perspective view of a finline structure illustrating construction of a simple biasing configuration. A finline substrate 140 is mounted within and between opposing first and second (grounded) mating metal halves 160, 162 of means forming free-space waveguide 16 to place a finline circuit 220 within the waveguide 16. On a front face 121 of the substrate there are four representative metallization regions 228, 219, 220 and 221, with metallization regions 219, 220 and 221 each bounding third metallization region 228, a first channel 210 of exposed dielectric parallel to the central axis 301 of the waveguide, a second channel 212 of exposed dielectric (i.e., no metallization) and a third channel 214 of similarly exposed dielectric, the second and third channels 212 and 214 extending from the first channel 210 to form a dielectric boundary around fourth metallization region 228.

Third metallization region 228 includes a stem 216 which is d.c. isolated from the waveguide 16. To assure proper isolation of the stem 216 from the waveguide half 162, the second waveguide half 162 is provided with a relief 164 aligned with the stem 216 and which is at least as wide as the combined width of the stem 216 and the channels 212 and 214.

According to the invention, a distributed capacitance means 44 is provided on the substrate 140, and preferably a distributed thin-film capacitor, which extends across the boundary between at least two metallization regions and preferably three metallization regions 228, 220 and 221. In a specific configuration, the distributed capacitance 44 is restricted to bridging metallization regions along only one side of a transmission slot, that is, the first dielectric channel 210. Distributed capacitance elements need not normally bridge the transmission slot. With such a structure it is possible to provide for r.f. continuity across dielectric boundaries between metallization regions while at the same time provide d.c. isolation between the metallization regions. The choice of values is a matter of engineering design.

In one finline configuration, the distributed capacitance 44 provides sufficient r.f. continuity such that the transmission slot (first channel 210) appears in the circuit as an unperturbed unilateral finline, despite the presence of a d.c. bias. According to the invention, d.c. bias may be applied externally to the pad 228 from a d.c. source connected to the stem 216.

Figure 7:
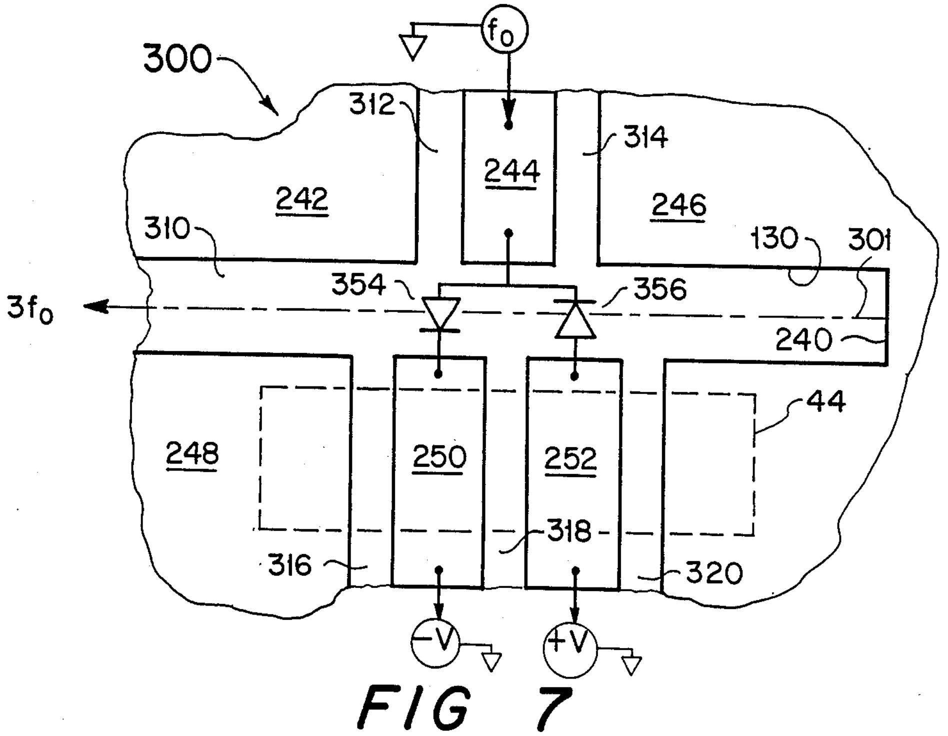
FIG. 7 is a plan view showing details of a finline gap region of a finline circuit having multiple biasing and specifically a biased r.f. multiplier.

Referring now to FIG. 7 there is shown a distributed capacitance structure 44 in a finline circuit 300 illustrating multiple external biasing. The illustrated circuit 300 may be operated as a multiplier. A thin film capacitor 44 cooperates with a first diode 354 and a second diode 356 as nonlinear elements for developing a desired frequency multiplication. A discussion of the detailed functioning of the circuit 300 is not pertinent to the present invention. It is to be noted nevertheless that bias may be applied independently to each of the diodes 354 and 356 respectively through first trace 250 and second trace 252 whereas both a common d.c. path and an r.f. path are provided to the diodes 354 and 356 via trace 244. In the structure illustrated, a quarter-wave slot 130 may be provided which has a backshort 240 at the quarter wave position of the multiplied frequency, for example, three times the fundamental frequency $3f_o$. Output of the multiplier circuit 300 into a surrounding waveguide cavity (as in FIG. 2) containing the finline circuit is via the finline channel defined by a first channel 310 along the axis 301 of the waveguide.

Figure 8:
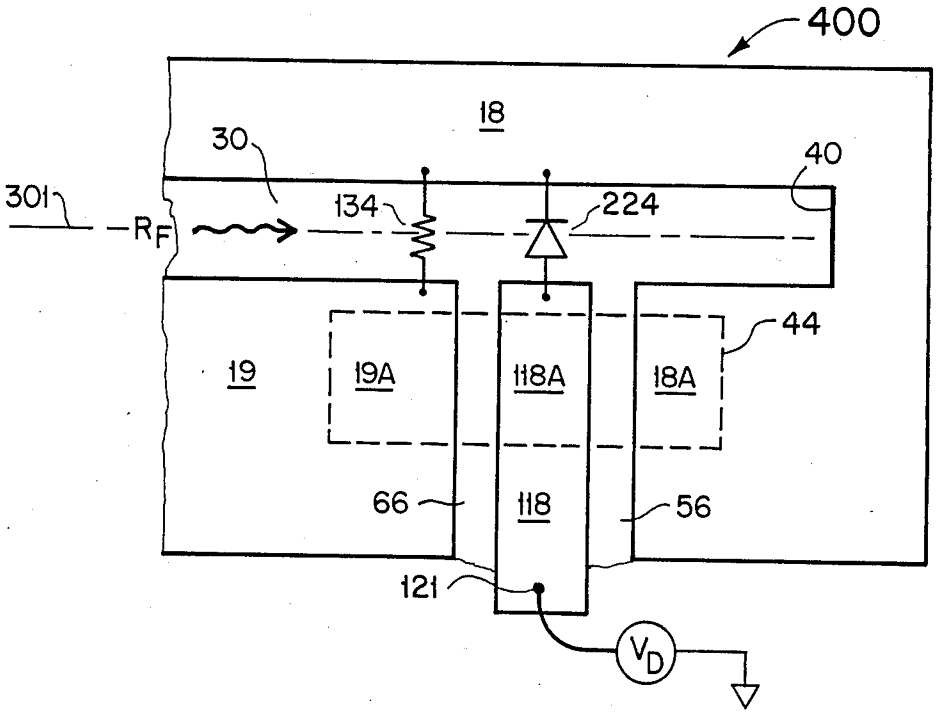
FIG. 8 is a plan view showing details of a finline gap region of another embodiment of a detector.

Referring now to FIG. 8, there is shown a further embodiment of a finline detector 400 similar in topology to the finline detector circuit 100 of FIG. 3. The circuit is formed on a dielectric substrate 21, and a finline slot 30 is disposed in line with a waveguide central axis 301 within a surrounding waveguide. The finline slot 30 terminates in a quarter-wave backshort 40 formed in metallization layer 18. A matching resistance means 134 is provided across finline slot 30 between first metallization layer 18 and second metallization layer 19. The matching resistance means may be a discrete resistor as in the embodiment of FIG. 3, or it may be a thin film resistor of for example tantalum nitride printed on the finline substrate and spanning the finline slot 30. A diode detector 224 is coupled across the finline slot 30 between first metallization layer 18 and d.c.-isolated third metallization layer 118. The third metallization layer 118 forms a trace between first and second dielectric channels 56 and 66. According to the invention, a thin-film capacitance means 44 is provided on the finline substrate 21 bridging first and second dielectric channels 56 and 66 and in r.f. contact with first metallization layer 18 (at region 18A), third metallization layer 118 (at region 118A), and second metallization layer 19 (at region 19A), thereby to provide for r.f. coupling between first and third metallization layers 18 and 118 and between second and third metallization layers 19 and 118. Detection of signals is provided at any point along the third metallization layer 118, preferably at an external terminal 121 remote from the finline slot 30. Further, according to the invention, a d.c. bias may be applied through the external terminal 121 thereby to set a desired level of signal detection. The ability to provide d.c. bias in this manner in a finline circuit represents added flexibility and advantage.

In operation, incoming r.f. signals along axis 301 are detected by the diode 224, and the capacitance means 44 provide r.f. continuity across the the metallization layers 18, 118 and 19 as well as provide a d.c. holding capacitance for voltage detected across the diode 224.

Figure 9:
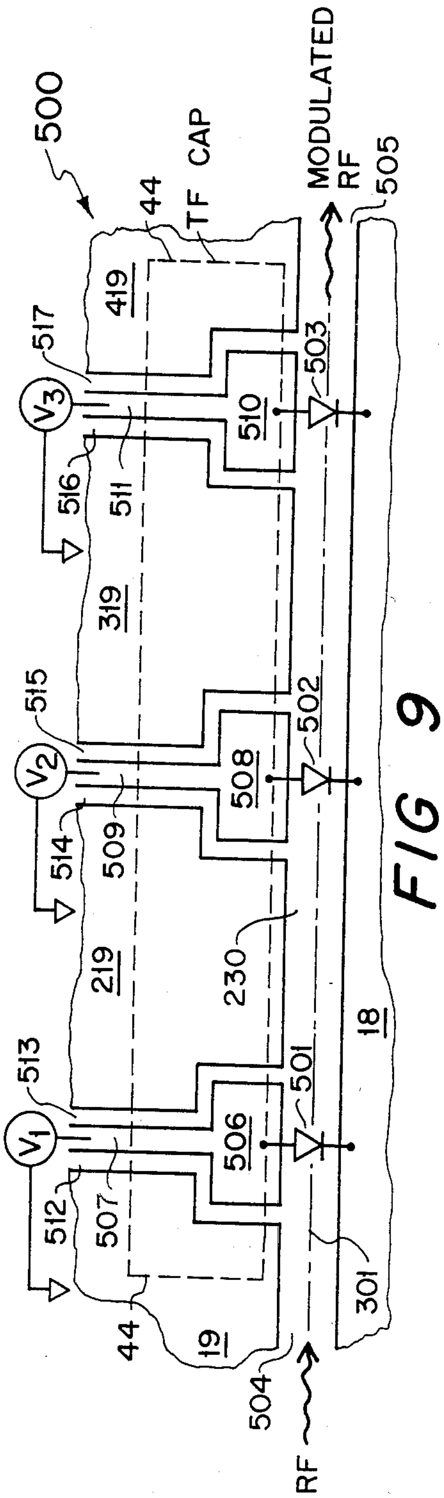
FIG. 9 is a plan view showing details of a finline gap region of one embodiment of an r.f. modulator.

FIG. 9 illustrates another application of the invention, namely, a microwave modulator 500. The microwave modulator 500 has an input port 504 for unmodulated r.f. signals and an output port 505 for modulated r.f. signals along a waveguide axis 301. In the illustrative embodiment, first, second and third P.I.N. diodes 501, 502 and 503 are coupled across a finline through-slot 230 between common metallization layer 18 and respective first, second and third terminal pads 506, 508 and 510. The terminal pads are separated by metallization layers 19, 219, 319 and 419, which are also on the side of the finline through-slot 230 opposite the common metallization layer 18. The pads 506, 508 and 510 are respectively d.c.-isolated from the adjacent metallization layers by dielectric channels 512, 513; 514, 515; and 516, 517. The pads 506, 508 and 510 are coupled, respectively with traces 507, 509 and 511 between the dielectric channels. According to the invention there is provided a distributed capacitance means 44 adjacent the finline through-slot 230 to bridge the metallization layers 19, 219, 319 and 419 and the adjacent pads 506, 508 and 510, thereby to provide r.f. signal continuity along the finline through-slot 230. Because each of the P.I.N. diodes 501, 502 and 503 is d.c. isolated from one another, the traces 507, 509 and 511 are advantageously provided with d.c. biasing V1, V2 and V3 of independent level and conditions. Independent biasing allows improved modulator match, greater dynamic range and broader or flatter response operational frequency range to an extent not attainable in any prior known finline modulator.

Figure 10:
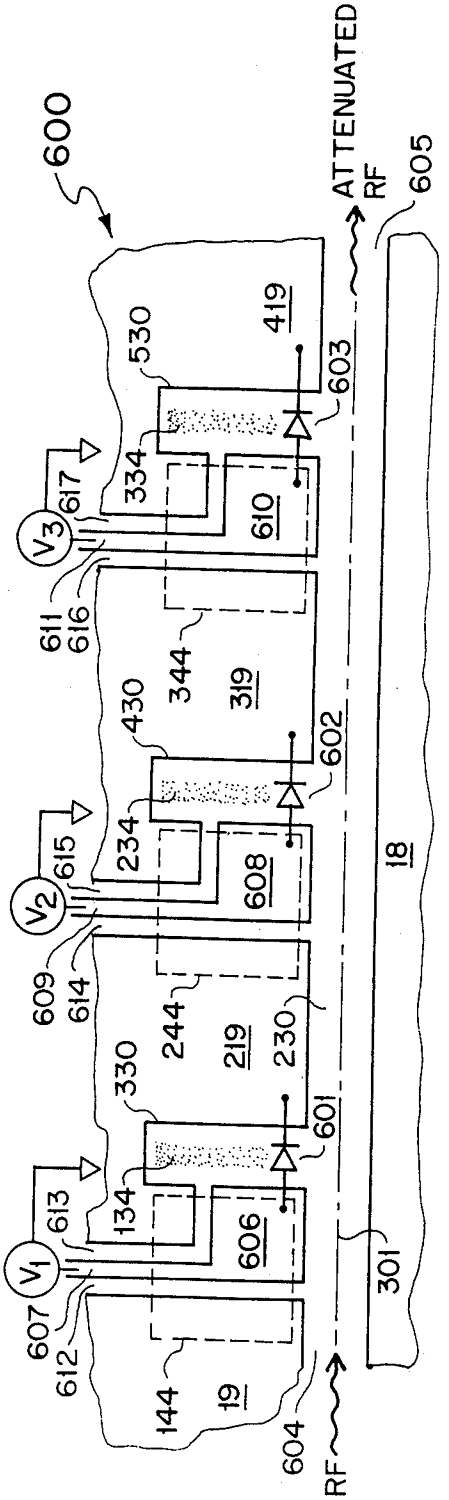
FIG. 10 is a plan view showing details of a finline gap region of one embodiment of an r.f. attenuator or switched filter element.

FIG. 10 illustrates a still further application of the invention, namely a finline stepped attenuator 600. The stepped attenuator 600 comprises a finline through-slot 230 for unattenuated r.f. input at the input end 604 and selectively attenuated r.f. output at the output end 605. A first metallization layer 18 is provided on one side of the finline through-slot 230. First, second and third slotline gaps 330, 430 and 530 are disposed transverse to and along the finline through-slot 230. The slotline gaps 330, 430 and 530 are preferably at right angles to the finline through-slot 230. The slotline gaps 330, 430 and 530 are preferably provided with respective energy absorption means 134, 234, and 334, such as lossy tantalum nitride.

In the illustrative embodiment, first, second and third diodes 601, 602 and 603 are coupled across the respective slotline gaps 330, 430 and 530 along finline through-slot 230 between metallization layers 219, 319, and 419 and pads 606, 608 and 610 opposing first metallization layer 18 across the finline through-slot 230. The terminal pads 606, 608 and 610 are separated from metallization layers 19, 219, 319 and 419 and are thus respectively d.c.-isolated from the adjacent metallization layers by dielectric channels 612, 613; 614, 615; and 616, 617. The pads 606, 608 and 610 are coupled, respectively, with traces 607, 609 and 611 between the dielectric channels. According to the invention, there is provided distributed capacitance means 144, 244 and 344 adjacent the finline through-slot 230 to bridge the metallization layer 19 to pad 606 and to metallization 219, to bridge metallization layer 219 to pad 608 and to metallization layer 319, and to bridge metallization layer 319 to pad 610 and to metallization layer 419. Each of the pads 606, 608 and 610 is disposed on one side only of the slotline gaps 330, 430 and 530, thereby to provide r.f. signal continuity selectively along the finline through-slot 230. The diodes 601, 602 and 603 when in the on state provide relatively low loss r.f. continuity bypassing and effectively shorting out the lossy transmission line segments provided by the slotline gaps 330, 430 and 530. Because each of the diodes 601, 602 and 603 is d.c.-isolated from one another and the metallization layers 19, 219, 319 and 419, then the traces 607, 609 and 611 and thus diodes 601, 602 and 603 can be independently and advantageously provided with d.c. biasing Vl, V2 and V3 to turn the diodes 601, 602, 603 on or off. When a diode 601, 602 or 603 across a slotline gap 330, 430 or 530 is in the off state, the slotline gap 330, 430 and 530 appears in the finline circuit 600 as a lossy transmission line in series with the finline through-slot 230. When a diode 601, 602 or 603 across a slotline gap 330, 430 or 530 is in the on state, the slotline gap does not appear in the finline circuit 600 because the r.f. energy is shunted through the diodes bypassing the lossy transmission lines and avoiding attenuation. Independent biasing allows stepped remote selectivity of attenuation level. The distributed capacitance 144, 244 or 344 according to the invention provides the r.f. continuity across the dielectric channel 613, 615 or 617 and along the margin of slotline gap 330, 430 or 530 which is needed to support the electric field energy (E-field) in the slotline gap 330, 430 or 530. Were there no r.f. continuity, there would be an undesired reflection of wave energy in the slotline gap 330, 430 or 530 at the dielectric channel 613, 615 or 617 between the pad 606, 608 or 610 and the metallization 219, 319 or 419.

This basic topology can also be used advantageously to construct finline switched filters. In such an application, the slotline gaps (preferably not containing a lossy material) may be formed with appropriate lengths to act as wave traps in a frequency-selective band reject filter network. The filter characteristics can be changed by selectively biasing the diodes to the on or off states.

Figure 11:
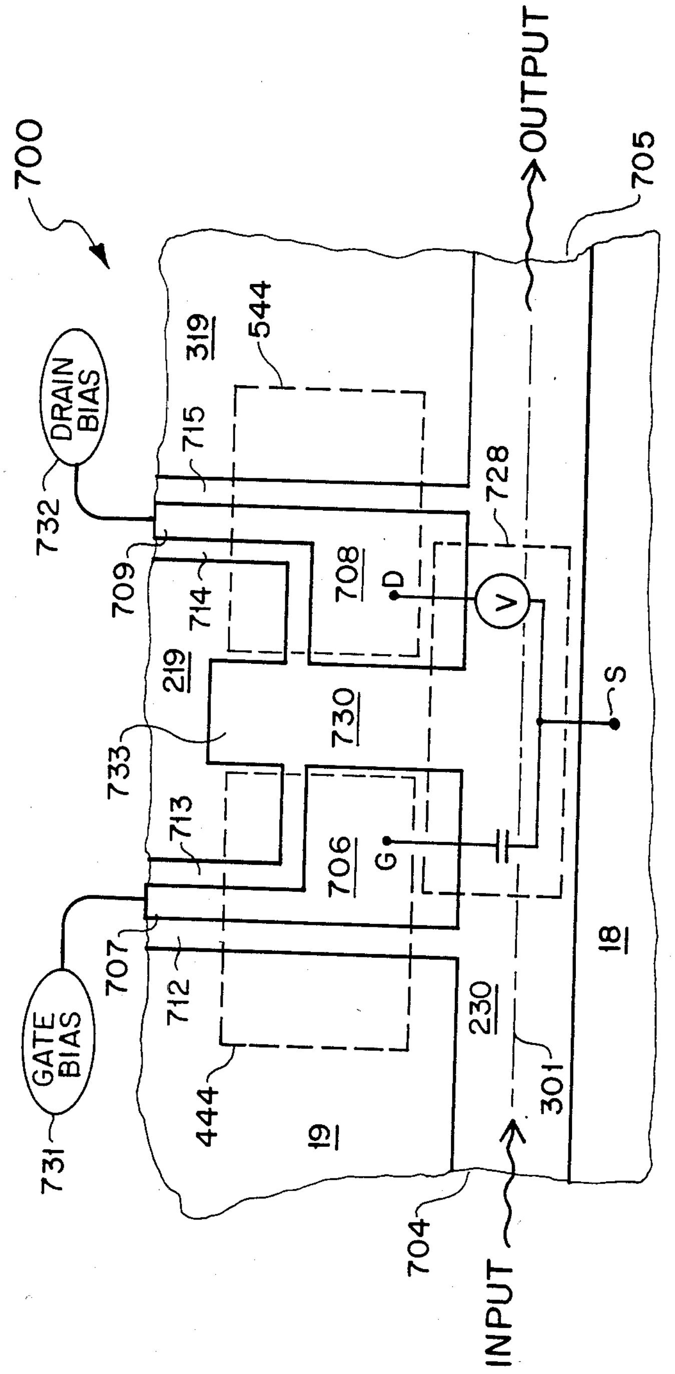
FIG. 11 is a plan view showing details of a finline gap region of one embodiment of an r.f. amplifier.

Referring now to FIG. 11, there is shown a plan view of details of one embodiment of an r.f. amplifier 700 using finline technology according to the invention. A simplified model of a beam lead field effect transistor (FET) 728, having a gate G, a source S and a drain D, is mounted across a finline through-slot 230 between d.c.-isolated terminals. Specifically, a metallization layer 18 serves as a terminal for source S, a first pad 706 serves as a terminal for gate G, and a second pad 708 serves as a terminal for drain D. Metallization layers 19, 219 and 319 surround the pads 706 and 708, being d.c. separated by dielectric channels 712, 713, 714 and 715. According to the invention, r.f. continuity is provided through the metallization 19 and the first pad 706 to metallization 219 by first capacitance means 444 bridging channel 712 and channel 713. Further, r.f. continuity is provided between metallization 219, the second pad 708 and metallization 319 by second capacitance means 544 bridging the channel 714 and the channel 715. Still further according to the invention, a first trace 707 is provided for d.c. coupling the first pad 706 with a gate bias 731. A second trace 709 is provided for d.c. coupling the second pad 708 with a drain bias 732. A slotline gap 730 in series connection with the through-slot 230 separates the first pad 706 from the second pad 708 and extends outwardly from the finline through-slot 230 to define a quarter-wave termination. This quarter-wave termination consists of the parallel combination of slotline gap 730 and shorted slotline stub 733, which is defined by the metallization layer 219. The distributed capacitance 444 or 544 according to the invention provides the r.f. continuity across the dielectric channel 713 or 714 and along each (lateral) margin of the slotline gap 730 and the shorted slotline stub 733 which is needed to support the electric field energy (E-field) in the slotline gap 730 and slotline stub 733. Were there no r.f. continuity, there would be an undesired reflection of wave energy in the slotline gap 730 at the dielectric channels 713 and 714. The parallel combination of slotline gap 730 and slotline stub 733 is to provide a series shorted stub which acts as an impedance converter so as to cause the appearance of an open circuit at the through-slot 230 where the active device 728 is positioned. This is necessary to provide electrical isolation between the input 704 and the output 705. Bias may be applied independently to the gate G through trace 707 and to the drain D through trace 709. The capacitance means 444 and 544, which may be thin film distributed capacitors, provide the necessary r.f. continuity to the finline amplifier circuit 700.

The invention has now been explained with reference to specific embodiments. Other embodiments will be apparent to those of ordinary skill in the art. It is therefore not intended that the invention be limited except as indicated by the appended claims.

In the claims:

1. In an apparatus for processing microwave energy in a waveguide, said apparatus including a dielectric substrate disposed within said waveguide and extending between opposing first and second interior walls of said waveguide, said dielectric substrate having thereon metallization on a first substantially planar surface, said metallization including at least a first metallization layer forming a first margin on a first side of a channel region of exposed dielectric surface, a second metallization layer forming a second margin on a second side of said channel region opposing said first margin, the improvement comprising:

at least a third margin of said second metallization layer on said second side of said channel region;

at least a third metallization layer forming a fourth margin adjacent and opposing said third margin, said third metallization layer being d.c. isolated from said second metallization layer; and distributed capacitance means comprising at least one metallization layer and at least one thin-film dielectric stratum, said distributed capacitance means being disposed on said dielectric substrate and bridging said third margin and said fourth margin adjacent said channel region, said capacitance means having at least sufficient capacitance value for r.f. continuity between said second metallization layer and said third metallization layer.

2. In the apparatus of claim 1, the improvement wherein said capacitance means comprises a thin-film capacitor formed of distributed layers of metallization over a dielectric layer upon an underlying base metallization layer, said base metallization layer bridging said third margin and said fourth margin.

3. In the apparatus of claim 1, the improvement wherein said capacitance means comprises:

a base metallization layer of tantalum disposed directly upon said dielectric substrate, a surface of said base metallization layer being oxidized to form an intermediate layer of tantalum pentoxide completely covering said base metallization layer;

a thin-film dielectric stratum forming a dielectric under at least adjacent third and fourth margins of said second metallization layer and said third metallization layer;

said thin-film dielectric stratum being of silicon dioxide; and metallization strata over said thin-film dielectric stratum defining at least said second metallization layer and said third metallization layer.

4. In the apparatus of claim 3, the improvement wherein said metallization strata comprise tantalum nitride, chrome and gold.

5. In the apparatus of claim 1, the improvement wherein said third metallization layer forms a fifth margin adjacent and opposing a sixth margin of a metallization layer on said second side of said channel region and wherein said distributed capacitance means further bridges said fifth margin and said sixth margin.

6. In the apparatus of claim 5, the improvement comprising means for biasing said third metallization layer.

7. In the apparatus of claim 5, the improvement comprising diode means coupled between adjacent metallization layers as a microwave signal detection means.

8. In the apparatus of claim 7, the improvement wherein said diode means is coupled between said first metallization layer and said third metallization layer.

9. In the apparatus of claim 8, the improvement wherein said third metallization layer is a stem for coupling to means for biasing said third metallization layer.

10. In the apparatus of claim 8, the improvement comprising stub means formed by said channel region for impedance matching.

11. In the apparatus of claim 5, the improvement comprising diode means coupled between adjacent metallization layers as a microwave signal multiplying means.

12. In the apparatus of claim 5, the improvement comprising:

a fourth metallization layer for carrying a microwave signal at a fundamental frequency;

a first diode means coupled between said fourth metallization layer and said third metallization layer across said channel region;

a sixth metallization layer adjacent said third metallization layer;

a second diode means coupled between said fourth metallization layer and said sixth metallization layer and antiparallel with said first diode means across said channel region; and wherein said distributed capacitance means bridges said second metallization layer, said third metallization layer and said sixth metallization layer, for forming a microwave signal multiplying means for supplying a microwave signal along said channel region which is a harmonic of said fundamental microwave signal.

13. In the apparatus of claim 12, the improvement wherein said third metallization layer is a stem for coupling to means for biasing said third metallization layer and wherein said sixth metallization layer is a stem for coupling to means for biasing said sixth metallization layer.

14. In the apparatus of claim 12, the improvement comprising stub means formed by said channel region for impedance matching.

15. In the apparatus of claim 1, the improvement:

wherein said channel region includes an input and an output in linear alignment with said input; and further comprising:

at least one diode means coupled across said channel region between said first metallization layer and a corresponding at least one third metallization layer; and wherein said a least one third metallization layer comprises a stem for coupling to means for applying a modulating signal to said at least one diode means through said at least one third metallization layer for producing a modulated r.f. signal at said output in response to application of an r.f. microwave signal at said input.

16. In the apparatus of claim 15, the improvement comprising a plurality of said diode means, and a plurality of said third metallization layers forming stems disposed in a series along said channel region between said input and said output for forming a microwave signal modulating means.

17. In the apparatus of claim 1, the improvement:

wherein said channel region includes an input and an output in linear alignment with said input; and further comprising:

at least one fourth metallization layer adjacent at least one said third metallization layer, wherein said capacitance means is further disposed between said third metallization layer and said fourth metallization layer;

at least one dielectric slotline gap formed between said third metallization layer and said fourth metallization layer;

at least one diode means coupled along one side of said channel region between said at least one fourth metallization layer and said at least one third metallization layer across an opening of said at least one slotline gap along said channel region;

energy absorption means in said at least one slotline gap for absorbing microwave energy upon application of microwave energy to said input and upon reverse bias of said at least one diode means; and wherein said at least one third metallization layer comprises a stem for coupling to means for applying a bias voltage to said at least one diode means through said at least one third metallization layer for attenuating an r.f. microwave signal at said output in response to application of said r.f microwave signal at said input.

18. In the apparatus of claim 17, the improvement comprising a plurality of fourth metallization layers, a plurality of said diode means, a plurality of said slotline gaps, a plurality of said absorption means and a plurality of said third metallization layers forming stems together disposed in a series along said channel region between said input and said output for forming a microwave signal attenuating means.

19. In the apparatus of claim 17, the improvement comprising stub means formed by said at least one slotline gap for impedance matching said slotline gap with said channel region.

20. In the apparatus of claim 1, the improvement:

wherein said channel region includes an input and an output in linear alignment with said input and wherein said third metallization layer defines a first stem for connection to a first external signal; and further comprising:

at least one fourth metallization layer adjacent at least one said third metallization layer, wherein said capacitance means is further disposed between said third metallization layer and said fourth metallization layer;

at least one fifth metallization layer;

at least one sixth metallization layer forming a fifth margin adjacent and opposing a sixth margin of said fourth metallization layer and forming a seventh margin adjacent and opposed to an eighth margin of said fifth metallization layer, said sixth metallization layer being d.c. isolated from said fourth metallization layer and said fifth metallization layer and wherein said sixth metallization layer defines a second stem for connection to a second external signal;

wherein said capacitance means is further disposed between said fourth metallization layer and said sixth metallization layer and between said sixth metallization layer and said fifth metallization layer;

a slotline stub region in said fourth metallization layer between said third metallization layer and said sixth metallization layer for r.f. isolation between said input and said output; and circuit means coupled between said third metallization layer and said first metallization layer across said channel region and coupled between said sixth metallization layer and said first metallization layer across said channel region as an amplifying means for an r.f. microwave signal in said channel region.

21. In the apparatus according to claim 20, the improvement wherein said circuit means is a field effect transistor having a gate electrode coupled to said third metallization layer, a source electrode coupled to said first metallization layer and a drain electrode couple to said sixth metallization layer.

22. An apparatus for detecting microwave energy in a waveguide, said apparatus including a dielectric substrate disposed within said waveguide and extending between opposing first and second interior walls of said waveguide, said dielectric substrate having thereon metallization on a first substantially planar surface, said metallization defining at least a detection region upon said first surface, said metallization defining a gap of exposed dielectric surface between opposing margins of metallization, said metallization further forming an input transition region of said dielectric surface, the improvement wherein:

said dielectric substrate forms a taper at a leading edge thereof from maximum waveguide dimension of said substrate to minimum waveguide dimension of said substrate thereby to define a transition from a free-space waveguide to a dielectrically-loaded waveguide, said taper defining an angle of no greater than thirty degrees with said first and second interior walls;

said metallization including at least a first metallization layer; and a termination region on said dielectric surface, said termination region being defined by said first metallization layer, said first metallization layer having formed therein a slot of exposed dielectric surface of a length up to about one quarter-wavelength in axial length of said waveguide, said slot defined by a first margin and a second margin opposing said first margin, said slot extending from said detection region to a termination boundary, said first metallization layer being d.c.-isolated from ground potential on said dielectric substrate in order to permit extraction of a detected signal as a d.c. signal from said first metallization layer.

23. The detecting apparatus of claim 22 wherein said metallization further includes a second metallization layer and a third metallization layer, said second metallization layer being d.c.-coupled to said first interior wall and said third metallization layer being d.c.-coupled to said second interior wall, said first and second metallization layers defining said detecting region at the position of closest convergence of opposing third and fouth margins of said second and third metallization layers on said dielectric surface, said detecting region having mounted thereto a diode, said diode being coupled between said third margin and said second margin across said detecting region, and thereby between said second metallization layer and said third metallization layer.

24. The detecting apparatus of claim 23 wherein said diode is a low barrier-type Schottky diode.

25. The detecting apparatus of claim 23 wherein said diode is a low barrier-type Schottky diode and wherein a resistance means is disposed at said detecting region between said third margin and said fourth margin for impedance matching.

26. The detecting apparatus of claim 25 wherein said resistance means is a lumped resistor.

27. The detecting apparatus of claim 23 wherein a resistance means is disposed at said detecting region between said third margin and said fourth margin for impedance matching.

28. The detecting apparatus of claim 27 wherein said resistance is a lumped resistor.

29. The detecting apparatus of claim 23 wherein a capacitance means is disposed between said second margin and said fourth margin adjacent said detection region, said capacitance means being of sufficient value to retain a voltage for voltage detection.

30. The detecting apparatus of claim 29 wherein said capacitance means is a distributed capacitor.

31. The detecting apparatus of claim 30 wherein a capacitance means is disposed between said second margin and said fourth margin adjacent said detection region, said capacitance means being of sufficient value to retain a voltage for voltage detection.

32. The detecting apparatus of claim 31 wherein said capacitance means is a distributed capacitor.

33. An apparatus for detecting microwave energy in a waveguide, said apparatus including a dielectric substrate disposed within said waveguide and extending between opposing first and second interior walls of said waveguide, said dielectric substrate having thereon metallization on a first substantially planar surface, said metallization defining at least a detection region upon said first surface, said metallization defining a gap of exposed dielectric surface between opposing margins of metallization, said metallization further forming an input transition region of said dielectric surface, the improvement wherein:

said metallization includes at least a first metallization layer, said apparatus further including a termination region on said dielectric surface, said termination region being defined by said first metallization layer, said first metallization layer having formed therein a slot of exposed dielectric surface of a length up to about one quarter-wavelength in axial length of said waveguide, said slot defined by a first margin and a second margin opposing said first margin, said slot extending from said detection region to a termination boundary, said first metallization layer being d.c.-isolated from ground potential on said dielectric substrate in order to permit extraction of a detected signal as a d.c. signal from said first metallization layer;

said metallization further including a second metallization layer and a third metallization layer, said second metallization layer being d.c.-coupled to said first interior wall and said third metallization layer being d.c.-coupled to said second interior wall, said first and second metallization layers defining said detecting region at the position of closest convergence of opposing third and fourth margins of said second and third metallization layers on said dielectric surface, said detecting region having mounted thereto a diode, said diode being coupled between said third margin and said second margin across said detecting region, and thereby between said second metallization layer and said third metallization layer.

34. The detecting apparatus of claim 33 wherein said diode is a low barrier-type Schottky diode.

35. The detecting apparatus of claim 33 wherein said diode is a low barrier-type Schottky diode and wherein a resistance means is disposed at said detecting region between said third margin and said fourth margin for impedance matching.

36. The detecting apparatus of claim 35 wherein said resistance means is a lumped resistor.

37. The detecting apparatus of claim 33 wherein a resistance means is disposed at said detecting region between said third margin and said fourth margin for impedance matching.

38. The detecting apparatus of claim 37 wherein said resistance is a lumped resistor.

39. The detecting apparatus of claim 33 wherein a capacitance means is disposed between said second margin and said fourth margin adjacent said detection region, said capacitance means being of sufficient value to retain a voltage for voltage detection.

40. The detecting apparatus of claim 39 wherein said capacitance means is a distributed capacitor.

41. The detecting apparatus of claim 40 wherein a capacitance means is disposed between said second margin and said fourth margin adjacent said detection region, said capacitance means being of sufficient value to retain a voltage for voltage detection.

42. The detecting apparatus of claim 41 wherein said capacitance means is a distributed capacitor.

43. An apparatus for detecting microwave energy in a waveguide, said apparatus including a dielectric substrate disposed within said waveguide and extending between opposing first and second interior walls of said waveguide, said dielectric substrate having thereon metallization on a first substantially planar surface, said metallization defining at least a detection region upon said first surface, said metallization defining a gap of exposed dielectric surface between opposing margins of metallization, said metallization further forming an input transition region of said dielectric surface, the improvement wherein:

said metallization includes at least a first metallization layer, and a second metallization layer, said first metallization layer being d.c. isolated from ground, said first metallization layer being separated from said second metallization layer by at least a first slit of dielectric material, and wherein said apparatus further includes at least a first distributed capacitance means comprising at least one metallization layer and at least one thin-film dielectric stratum, said distributed capacitance means being disposed along said first slit and bridging between said first metallization layer and said second metallization layer, wherein capacitance of said distributed capacitance means is sufficient to provide a.c. coupling between said first metallization layer and said second metallization layer.

44. The detecting apparatus of claim 43 wherein said metallization further includes a third metallization layer, said second metallization layer being d.c.-coupled to said first interior wall and said third metallization layer being d.c.-coupled to said second interior wall, said third metallization layer being separated from said first metallization layer by at least a second slit of dielectric material, and wherein said apparatus further includes at least a second distributed capacitance means disposed along said second slit and bridging between said first metallization layer and said third metallization layer, wherein capacitance of said second distributed capacitance means is sufficient to provide a.c. coupling between said first metallization layer and said third metallization layer.

45. The detecting apparatus of claim 44 wherein said first and second metallization layers define said detecting region at the position of closest convergence of opposing third and fourth margins of said second and third metallization layers on said dielectric surface, said detecting region having mounted thereto a diode, said diode being coupled between said third margin and said second margin across said detecting region, and thereby between said second metallization layer and said third metallization layer.

46. The detecting apparatus of claim 45 wherein said diode is a low barrier-type Schottky diode.

47. The detecting apparatus of claim 45 wherein said diode is a low barrier-type Schottky diode and wherein a resistance means is disposed at said detecting region between said third margin and said fourth margin for impedance matching.

48. The detecting apparatus of claim 47 wherein said resistance means is a lumped resistor.

49. The detecting apparatus of claim 45 wherein a resistance means is disposed at said detecting region between said third margin and said fourth margin for impedance matching.

50. The detecting apparatus of claim 49 wherein said resistance is a lumped resistor.

51. The detecting apparatus of claim 45 wherein a capacitance means is disposed between said second margin and said fourth margin adjacent said detection region, said capacitance means being of sufficient value to retain a voltage for voltage detection.

52. The detecting apparatus of claim 51 wherein said capacitance means is a distributed capacitor.

53. The detecting apparatus of claim 52 wherein a capacitance means is disposed between said second margin and said fourth margin adjacent said detection region, said capacitance means being of sufficient value to retain a voltage for voltage detection.

54. The detecting apparatus of claim 53 wherein said capacitance means is a distributed capacitor.

* * * * *